(12) United States Patent
Mellein

(10) Patent No.: US 12,216,145 B2
(45) Date of Patent: Feb. 4, 2025

(54) ANECHOIC CHAMBER FOR TESTING A DEVICE UNDER TEST OVER-THE-AIR, A SYSTEM, AND A METHOD

(71) Applicant: Rohde & Schwarz GmbH & Co. KG, Munich (DE)

(72) Inventor: Heinz Mellein, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 112 days.

(21) Appl. No.: 18/062,731

(22) Filed: Dec. 7, 2022

(65) Prior Publication Data

US 2023/0221359 A1     Jul. 13, 2023

(30) Foreign Application Priority Data

Jan. 10, 2022     (EP) .................................. 22 150 747

(51) Int. Cl.
*G01R 29/08*          (2006.01)
(52) U.S. Cl.
CPC ..... *G01R 29/0821* (2013.01); *G01R 29/0878* (2013.01)
(58) Field of Classification Search
CPC ............ G01R 29/0878; G01R 29/0821; G01R 29/105
See application file for complete search history.

(56) References Cited

U.S. PATENT DOCUMENTS

| | | | | |
|---|---|---|---|---|
| 2005/0001780 A1* | 1/2005 | Aisenbrey | .......... | H01R 13/6599 343/873 |
| 2005/0206550 A1* | 9/2005 | Moller | .............. | G01R 29/0821 342/173 |
| 2019/0331719 A1* | 10/2019 | Cummings | ........ | G01R 29/0878 |
| 2019/0391195 A1* | 12/2019 | Kvarnstrand | .......... | H04B 17/15 |
| 2024/0069145 A1* | 2/2024 | Deixler | ................... | G01S 13/87 |

FOREIGN PATENT DOCUMENTS

| | | | | | |
|---|---|---|---|---|---|
| CN | 110120591 A | * | 8/2019 | ............. | H01Q 15/00 |
| CN | 112462168 A | | 3/2021 | | |
| CN | 113163432 A | * | 7/2023 | ........... | H04B 17/309 |
| WO | 2020/254030 A1 | | 12/2020 | | |

OTHER PUBLICATIONS

CN—113163432—Machine Translation with Figures_07.23.2021 (Year: 2021).*
CN—110120591—Machine Translation with Figures_08.13.2019 (Year: 2019).*

* cited by examiner

*Primary Examiner* — Eman A Alkafawi
*Assistant Examiner* — Suresh K Rajaputra
(74) *Attorney, Agent, or Firm* — CHRISTENSEN O'CONNOR JOHNSON KINDNESS PLLC

(57) ABSTRACT

The present disclosure generally relates to an anechoic chamber for testing a device under test over-the-air, a system, and a method. The anechoic chamber includes at least one reflecting surface being configured to variably manipulate in a defined manner at least one reflection process of at least one electromagnetic wave usable for testing the device under test.

15 Claims, 4 Drawing Sheets

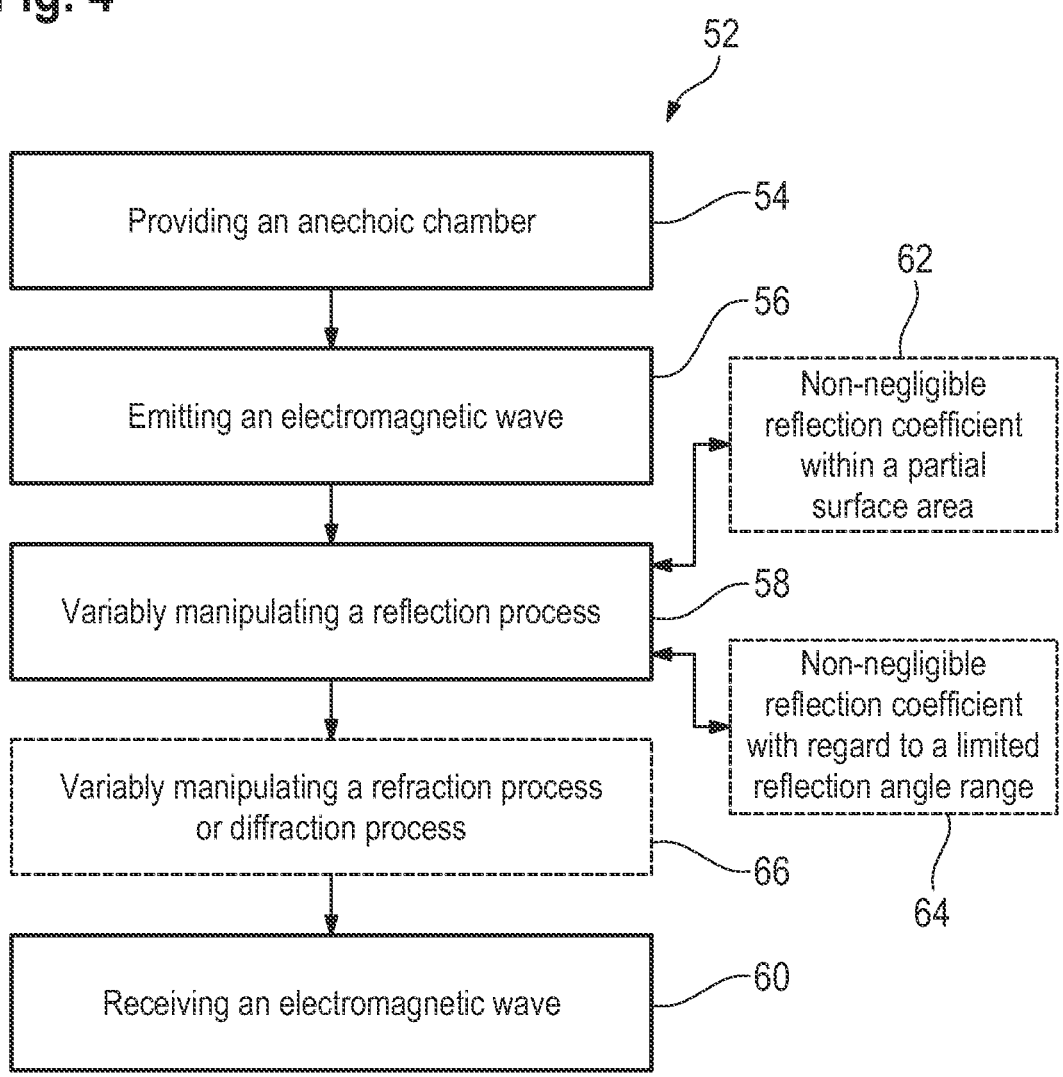

ANECHOIC CHAMBER FOR TESTING A DEVICE UNDER TEST OVER-THE-AIR, A SYSTEM, AND A METHOD

FIELD OF THE DISCLOSURE

The present disclosure generally relates to an anechoic chamber for testing a device under test over-the-air, a system, and a method.

BACKGROUND

In case of radio frequency (RF) measurements with respect to a device under test (DUT) well-defined testing conditions are of high importance. Measurement chambers are used to establish defined test environments reducing external noise which may cause disturbances on the measurement signals used for testing the DUT. These test environments usually comprise several reflection surfaces capable of reflecting electromagnetic waves, which are located in series such that the electromagnetic waves are reflected several times by the different reflection surfaces. Hence, these reflection surfaces located in series established a reflection system. However, once the reflecting surfaces are installed modification of their individual reflecting properties or rather the overall reflection property of the entire reflection system causes high efforts as changing one individual property has an impact on the entire system, namely the subsequent reflections surfaces such that comparatively large maintenance expenses occur. Furthermore, the testing procedure has to be interrupted since manual access to the test environment is needed. Accordingly, modifying the reflecting properties of a reflecting surface also is time consuming. Thus, efficient test scenarios for evaluating the RF-related properties of a DUT are impossible.

Accordingly, there is need for a cost-effective and fast way to optimize the test procedure of a DUT providing improved flexibility with regard to desired reflecting properties. In particular, this flexibility is sought to be provided while also time savings are achieved.

SUMMARY

The subject matter of the independent claim satisfy the respective need or others. Example embodiments are indicated within the dependent claims and the following description, each of which, individually or in combination, may represent aspects of the disclosure.

A summary of certain embodiments disclosed herein is set forth below. It should be understood that these aspects are presented merely to provide a brief summary of these certain embodiments and that these aspects are not intended to limit the scope of this disclosure. This disclosure may encompass a variety of aspects that may not be set forth below.

According to an aspect, an anechoic chamber for testing a device under test (DUT) over-the-air (OTA) is provided. In an embodiment, the anechoic chamber comprises at least one reflecting surface being configured to variably manipulate in a defined manner at least one reflection process of at least one electromagnetic wave usable for testing the device under test.

Within the present disclosure variably manipulating in a defined manner may be considered to refer to the ability to alter a property in a desired fashion. The so configured reflecting surface may also be referred to as an "intelligent" reflecting surface, namely due to its ability of property adaption in a controlled manner. Thus, the at least one reflecting surface is configured to variably manipulate the at least one reflection process in a controlled manner, namely based on a controlling. Therefore, a control circuit, e.g. established by a processing circuit, may be provided that controls the reflecting surface accordingly. Hence, a property of the reflecting surface is variably controlled by the control circuit, which causes the variable manipulation of the reflection process. Accordingly, a property is altered (in a controlled manner) such that at least one reflection process of at least one electromagnetic wave usable for testing the DUT is influenced.

During the modification of the at least one reflecting surface generally no or at least only a negligible interruption of the testing procedure may be caused. In other words, the modification of the at least one reflecting surface may be performed "in-field", e.g. by a control signal. This means that the modification may be achieved with the testing setup not being modified in any other aspect of relevance. In some embodiments, the arrangement of the anechoic chamber and the DUT relative to each other may remain unaltered.

Consequently, maintenance expenses for modifying the properties of the at least one reflecting surface are avoided.

Furthermore, manual access to the at least one reflecting surface for altering the reflection properties is not necessary. Thus, the time needed to modify the properties of the at least one reflecting surface such that the reflection process is influenced is greatly reduced.

As mentioned above, at least one processing circuit may be coupled to the at least one reflecting surface. The processing circuit may be configured to alter the reflecting properties of the at least one reflecting surface. Accordingly, the processing circuit may establish the control circuit for controlling purposes. For example, the at least one reflecting surface may receive control signals from the processing circuit, e.g. electric signals. These control signals may cause a modification of the reflecting properties of the at least one reflecting surface. In an embodiment, the control signals may provide a stimulus such as an electric field which causes portions of the at least one reflecting surface to modify their properties such that the reflecting properties of the at least one reflecting surface as a whole are altered. The processing circuit may be part of the anechoic chamber or coupled thereto.

Different types of stimuli may be usable as well in order to influence the reflecting properties of the at least one reflecting surface. For example, pressure changes may influence the reflecting properties.

Generally, the adaption of the property of the reflection surface concerns a modification of a property of the reflection surface, which influences the reflection process. The respective property relates to an inherent material characteristic of the reflection surface, for instance reflectance, absorptance, transmittance, and/or (frequency-dependent) permittivity and further inherent material characteristics influencing reflection processes.

The direction of the electromagnetic wave reflected may be manipulated accordingly, which corresponds to a beam-forming/beam-shaping process of the reflected electromagnetic wave.

Accordingly, physically turning of the reflecting surface does not take place. In other words, there are no moving parts associated with the reflecting surface, which are involved in variably manipulating the reflection process.

In one aspect, the at least one reflecting surface is configured, for example, to variably have a non-negligible reflection coefficient within a partial surface area thereof. In other words the at least one reflecting surface may be subdivided into different partial surface areas. These partial surface areas may be modifiable on an individual basis. Hence, the first partial surface area may be modified such that it only shows a negligible reflecting coefficient with regard to the at least one electromagnetic wave usable for testing the DUT. A second partial surface area being different from the first partial surface area may be simultaneously modified such that it shows non-negligible reflecting properties. In other words, the at least one reflecting surface may be influenced such that only distinct portions of its surface area reflect the at least one electromagnetic wave usable for testing the DUT. For example, a processing circuit can be coupled to various partial surface areas of the at least one reflecting surface and control them on an individual basis.

Cumulatively or alternatively, the at least one reflecting surface is configured to variably have a non-negligible reflection coefficient with regard to a limited reflection angle range. The reflection angle depends on the incident angle of the electromagnetic wave to be reflected. However, the ability to reflect an electromagnetic wave also depends on the properties of the surface area. Since the surface area of the at least one reflecting surface may be influenced, also the reflection coefficient may be non-negligible with regard to only a limited first reflection angle range. Accordingly, tailored reflecting properties may be established in accordance with the desired needs.

Optionally, the at least one reflecting surface is configured to variably manipulate at least one refraction process or diffraction process of the at least one electromagnetic wave. Refraction and diffraction processes are additional processes which may occur if an electromagnetic wave impinges on a surface. Like the reflecting properties, the properties with regard to refraction and diffraction processes at least partially depend on the surface properties of the respective surface. Since the properties of the at least one reflecting surface are modifiable, such modifications also advantageously influence the ability to manipulate refraction and diffraction processes in view of the at least one electromagnetic wave. Hence, additional aspects of the electromagnetic wave may be altered according to the desired needs.

The anechoic chamber may also comprise a testing area. The testing area may specify a limited volume in space where the device under test (DUT) is to be placed in order to be tested. For example the testing area may comprise a quiet zone. Generally, the quiet zone provided by the anechoic chamber is a volume within the anechoic chamber where any reflected energy from walls, e.g. side walls, ceiling and floor, will be much lower than any of the features of interest on the radiation pattern. In other words, the anechoic chamber provides a "quiet" environment for electromagnetic wave measurements within the quiet zone of the testing area since no echo and no extraneous energy occur in the respective volume associated with the quiet zone.

The reflecting surface may correspond to a meta-structure reflect-array. As known, meta-structures are an artificial medium with optical characteristics developed by arranging structures that are sufficiently small with respect to wavelength in the form of an array. The meta-structure reflect-array may perform beam-forming of the reflected electromagnetic wave. For instance, the position/orientation of the structures may be altered in a controlled manner, thereby manipulating the reflection process accordingly.

The reflection surface may be provided on a reflection body having a reflection layer (coating) that comprises reflective elements integrated that may be stimulated/controlled, thereby adapting the reflection process. Moreover, the reflection surface may be provided by a liquid crystal that establishes a reflection body. The liquid crystal can be controlled to adapt its properties, thereby manipulating the reflection process in a defined manner. For instance, the liquid crystal is controlled so as to change the direction of the reflected electromagnetic wave without physically turning. Thus, there are no moving parts.

Further, the reflecting surface may be part of a holographic beam forming device, e.g. a device having at least one biased control component like a varactor or transistor. The reflection process of an electromagnetic wave to be reflected can be dynamically and rapidly controlled by manipulating the bias state of the respective control components, thereby establishing a beam steering.

According to another aspect, a system for testing a DUT over-the-air is provided. In an embodiment, the system comprises the anechoic chamber as described hereinabove and a DUT. The anechoic chamber comprises a testing area. The system has at least one transmission antenna element and/or at least one reception antenna element. The DUT and the at least one reflecting surface are arranged within the testing area.

The transmission antenna element and/or the reception antenna element may be provided by the DUT itself or by devices being separate of the DUT and being arranged within the anechoic chamber.

The transmission antenna element may be configured to transmit an electromagnetic wave into a volume of the anechoic chamber. A transmission antenna element may be associated with at least one transmission stream describing the properties electromagnetic wave to be transmitted.

The reception antenna element may be configured to receive an electromagnetic wave from the volume of the anechoic chamber. A reception antenna element may be associated with at least one reception stream describing the properties of the received electromagnetic wave.

The system advantageously provides the ability to alter reflecting properties of the at least one reflecting surface "in-field". No maintenance work or manual access to the anechoic chamber is required. Consequently, the testing procedure may be performed at shorter timescales and with reduced maintenance expenses.

The ability for over-the-air (OTA) testing of the DUT is achieved since a wireless cable method (WCM) may be applied to test the DUT according to a radiated testing method. Here, signals can be steered over-the-air, e.g. by beam-steering, to respective antenna ports, namely the antennas of the DUT or antennas being separate of the DUT, just like in the conducted cable case but without RF cable connections.

During the testing of the DUT, the inverse channel matrix G can be applied on the measurement signals generated, thereby ensuring that the inverse channel matrix G compensates/equalizes the channel matrix H that is present due to the OTA measurement performed. Accordingly, the inverse channel matrix G and the channel matrix H together, namely their respective product, correspond to the identity matrix that corresponds to a cable setup. Therefore, cable-like properties are ensured even though OTA testing is performed, namely a wireless testing.

Stated differently, the OTA link of the antenna elements causes disturbances in each of the signals (streams) of the antenna elements and between those signals (streams). This leads to generally unknown correlations between the transmitted electromagnetic waves and the received electromagnetic waves. However, the performance tests which are carried out require a well-defined signal correlation involving fading effects. The inverse channel matrix G is chosen such that it inverts the effects introduced by the OTA link. Accordingly, a virtual wireless cable may be created once the appropriate inverse channel matrix G is found. In case the appropriate inverse channel matrix G is found, the measurement configuration corresponds to perfect radio frequency (RF) conditions such that any lower layer impairments are compensated for.

In other words, the DUT may be tested depending on the WCM. Advantageously, the flexibility of the testing mechanism is improved compared to conductive cable methods.

In addition, it is not necessary to locate a cable within the anechoic chamber, which may have an influence on the testing. Thus, better or more reliable measurement results are ensured. Further, wireless cable method testing is mandatory with regard to certain measurement profiles, such as e.g. base band tactical data link fading profiles.

Optionally, the at least one reflecting surface at least partially comprises a cylindrical shape. A cylindrical shape provides a good compromise between symmetry and a compact volume. For a DUT placed within the center of the cylindrical shape or in correspondence with the longitudinal axis of the cylindrical shape, all surface portions of the at least one reflecting surface have the same distance with regard to the DUT. Therefore, a higher degree of symmetry is provided compared to different shapes, such as cuboid shapes. Accordingly, the reliability of the evaluation of the underlying signals of the testing procedure is improved.

Alternatively or cumulatively, the anechoic chamber comprises at least one wall portion delimiting the testing area and having the at least one reflecting surface. This means that the wall portion of the anechoic chamber which defines the testing area is also used to establish the at least one reflecting surface. Hence, a more compact volume of the anechoic chamber may be established.

In one aspect, the at least one reflecting surface may be, for example, substantially flat. Flat surfaces are generally easy and cheap to manufacture. Thus, the manufacturing costs of the anechoic chamber are low. Within the present disclosure, flat refers to the property that the respective surface portion shows only a negligible height profile of the surface. No significant protrusions or depressions are present. Although the at least one reflecting surface may generally follow a distinct curvature, such as having a cylindrical shape, the at least one reflecting surface may still be substantially flat. Despite the general curvature of the at least one reflecting surface, there are no additional protrusions or depressions present such that no deviations of the general curvature of the at least one reflecting surface may be noticeable or may have a noticeable influence on the reflecting properties. Still such reflecting surfaces may be considered to be flat.

Optionally, the anechoic chamber may comprise at least two transmission antenna elements and at least two reception antenna elements establishing a multiple-input/multiple-output (MIMO) antenna array. Each transmission antenna element is associated with at least one transmission stream and each reception antenna element is associated with at least one reception stream of the MIMO antenna array. Generally, the transmission and reception antenna elements may be arranged in an at least two dimensional manner, namely in column(s) and row(s). For instance, a line of transmission antenna elements is provided that has adjacent lines of reception antenna elements. Hence, lines of transmission antenna elements and reception antenna elements may be arranged in a plane in an alternating manner. The MIMO antenna array provides the possibility to establish complex electromagnetic field configurations to test the DUT according to multiple aspects.

Alternatively, only a single transmission antenna element and multiple reception antenna elements may be provided establishing a SIMO (single input/multiple output) antenna array. According to a further alternative, multiple transmission antenna elements and only a single reception antenna element are provided. Thereby, a MISO (multiple input/single output) antenna array is established.

The respective antenna elements provide (virtual) channels (streams) among each other. For instance, a MIMO multistatic array with ten reception antenna elements and ten transmission antenna elements has 100 (virtual) channels. An equivalent SIMO multistatic array has one reception antenna element and 100 transmission antenna elements. In a similar manner, an equivalent MISO multistatic array has 100 reception antenna elements and one transmission antenna element. Obviously, the MIMO multistatic array is preferred while having a total number of 20 antenna elements compared to 101 antenna elements in case of the MISO or rather SIMO multistatic array.

Optionally, the quiet zone may be established by at least one of an indirect far field and a direct far field. The anechoic chamber is advantageously suitable for quiet zones established by both types, indirect and direct far fields. Generally, the at least one reflecting surface may be provided such that it reflects signals emitted from an antenna element so as to create far field conditions, and therefore the quiet zone, at small distances since the propagation path of the signals emitted is enlarged by the at least one reflecting surface. Moreover, an antenna array (MIMO antenna array) may be provided that comprises several antennas that are individually controlled so as to create a direct far field and, therefore, a quiet zone in a small chamber directly.

Generally, over-the-air (OTA) test scenarios may be applied that are used for testing the MIMO performance of the device under test and/or the radio resource management (RRM) behavior of the device under test.

In some embodiments, the at least one reflecting surface at least partially comprises one of graphene, nonlinear materials, non-foster, ferrites, Yttrium Iron Garnet (YIG), barium strontium titanate (BST), liquid crystals, microfluidics, mechanical, micro-electro-mechanical systems (MEMS), PIN diodes, and varactors (voltage controlled capacitors). These different materials and device types may provide varying reflecting properties. Accordingly, a wide flexibility of the at least one reflecting surface provided such that the desired needs can be met best.

Additionally, the system may comprise, for example, at least one processing circuit that is coupled to the at least one transmission antenna element and/or the at least one reception antenna element. The at least one processing circuit is also coupled to the at least one reflecting surface. For example the at least one processing circuit may be configured to modify the reflecting properties of the at least one reflecting surface depending on the characteristics of the transmitted or received electromagnetic waves. Spoken differently, the processing circuit corresponds to a control circuit since the processing circuit controls the reflecting surface, e.g. its at least one property.

For example, the processing circuit may be configured to control the reflecting surface such that the polarization axis of an electromagnetic wave reflected is altered.

Furthermore, the processing circuit may also be configured to control the polarization axis of an electromagnetic wave generated/transmitted and/or to evaluate a polarization of an electromagnetic wave received by the at least one reception antenna element. Additional characteristics of the transmitted or received electromagnetic waves may be determined, controlled, or evaluated using the at least one processing circuit.

In general, the reflecting properties of the at least one reflecting surface may be modified by the at least one processing circuit depending on the controlled or evaluated properties of the electromagnetic wave.

Generally, the property of the reflection surface is adapted such that the reflection process is altered even though the remaining conditions are maintained the same, e.g. the characteristics of the signal impinging on the reflecting surface.

According to an additional aspect, a method of testing a DUT over-the-air is provided. In an embodiment, the method comprises the step of providing an anechoic chamber having a testing area with the DUT and at least one reflecting surface arranged therein. The anechoic chamber comprises at least one transmission antenna element and/or at least one reception antenna element. The method also comprises the step of emitting at least one electromagnetic wave. Furthermore, the method comprises the step of variably manipulating, using the at least one reflecting surface, at least one reflection process of the at least one electromagnetic wave in a defined manner. The method may also comprise the step of receiving the at least one electromagnetic wave reflected by the at least one reflecting surface.

Consequently, a method is provided which enables the reflecting properties of the at least one reflecting surface to be modified "in-field". No interruption of the testing procedure is caused. Manual access to the at least one reflecting surface is not required. The testing arrangement of the beauty within the testing area of the anechoic chamber may remain unchanged while modifying the reflecting properties of the at least one reflecting surface.

Optionally, the at least one reflecting surface is variably manipulated to have a non-negligible reflection coefficient within a partial surface area thereof.

Also, the at least one reflecting surface may be variably manipulated to have a non-negligible reflection coefficient with regard to a limited reflection angle range.

According to a further aspect, the method may also comprise, for example, the step of variably manipulating, using the at least one reflecting surface, at least one refraction process or diffraction process of the at least one electromagnetic wave.

In addition, at least two transmission antenna elements may be used to emit multiple electromagnetic waves. Also, at least two reception antenna elements maybe used to receive multiple electromagnetic waves reflected by the at least one reflecting surface to test the DUT based on a MIMO antenna array.

All features and embodiments disclosed with respect to any aspect of the present disclosure are combinable alone or in (sub-)combination with any one of the remaining aspects of the present disclosure including each of the preferred embodiments thereof, provided the resulting combination of features is reasonable to a person skilled in the art.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 4 is a schematic drawing of a method of testing a device under device under test over-the-air.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. All of the features disclosed hereinafter with respect to the example embodiments and/or the accompanying figures can alone or in any sub-combination be combined with features of the aspects of the present disclosure including features of preferred embodiments thereof, provided the resulting feature combination is reasonable to a person skilled in the art.

Figure 1:
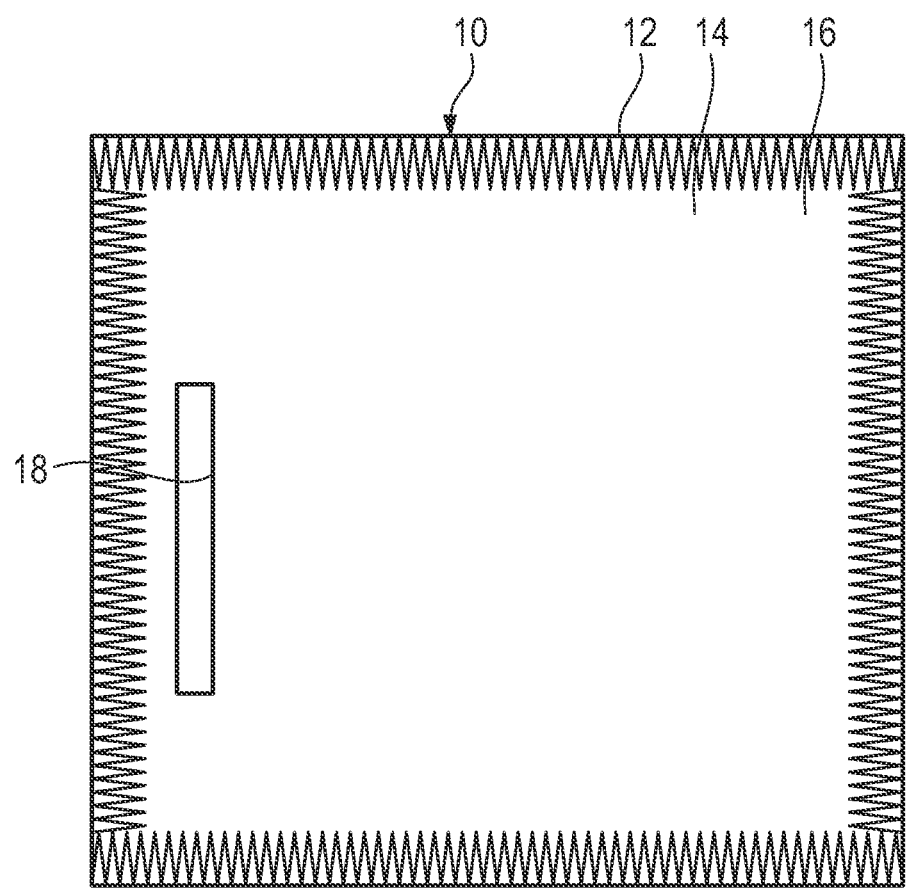
FIG. 1 is a schematic drawing of an anechoic chamber for testing a device under test over-the-air.

FIG. 1 is a schematic drawing of an anechoic chamber 10 for testing a device under test (DUT) over-the-air (OTA). The anechoic chamber 10 comprises a housing 12. The housing 12 defines an interior volume 14 of the anechoic chamber 10. The interior volume 14 comprises a testing area 16 of the anechoic chamber 10 in which the DUT is located for testing purposes.

Within the testing area 16 of the anechoic chamber 10 a reflecting surface 18 is arranged. The reflecting surface 18 is configured to variably modify in a defined/controlled manner at least one reflection process of an electromagnetic wave propagating through the interior volume 14 of the anechoic chamber 10.

Figure 2:
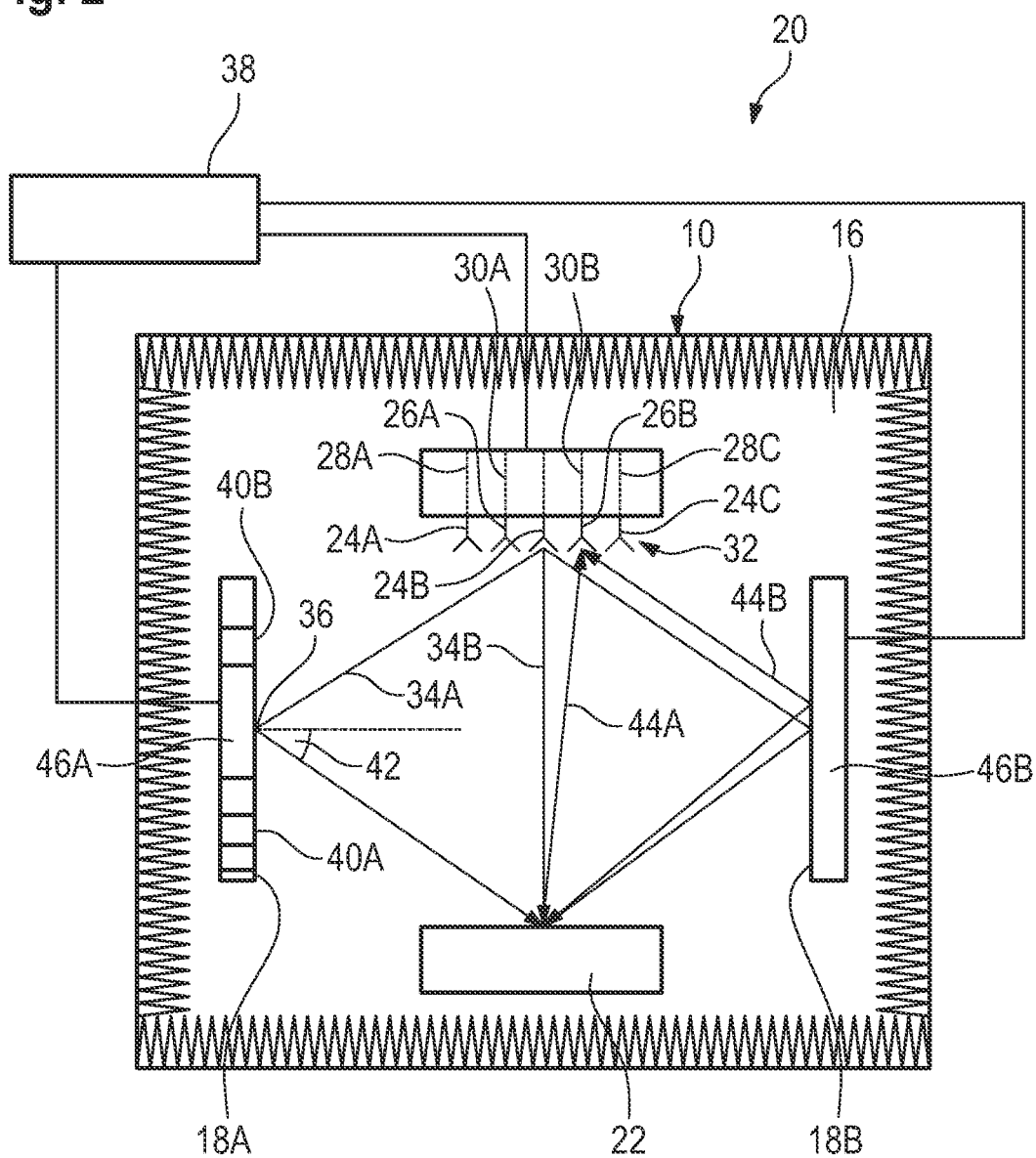
FIG. 2 is a schematic drawing of a system for testing a device under test over-the-air.

FIG. 2 is a schematic drawing of a system 20 for testing a device under test (DUT) 22 over-the-air. In this case the anechoic chamber 10 comprises a first reflecting surface 18A and a second reflecting surface 18B arranged within the testing area 16, e.g. associated with side walls of the anechoic chamber 10. Moreover, the system 20 comprises several transmission antenna elements 24A to 24C and reception antenna elements 26A, 26B arranged within the testing area 16.

In the shown embodiment, the several transmission antenna elements 24A to 24C and reception antenna elements 26A, 26B are part of an antenna array. Alternatively, the several transmission antenna elements 24A to 24C and reception antenna elements 26A, 26B may be separately formed and located in different regions of the anechoic chamber 10.

Each transmission antenna element 24A to 24C has a transmission stream 28A to 28C associated thereto. Also, each reception antenna element 26A, 26B has a reception stream 30A, 30B associated thereto.

The transmission antenna elements 24A to 24C are arranged according to first row while the reception antenna elements 26A, 26B are arranged according to the second row. Thereby, a multidimensional multiple input/multiple output (MIMO) antenna array 32 is established. In principle, only a single transmission antenna element 24A or a single reception antenna element 26A need to be present, thereby establishing a single output/multiple input (SIMO) antenna array or a multiple output/single input (MISO) antenna array. Of course, the number of antenna elements may also be different than described before. In some embodiments, the number of transmission antenna elements 24A and reception antenna elements 26A may also be same.

Within the present embodiment the MIMO antenna array 32 is shown to be separate of the DUT 22. However, this is optional. The transmission antenna elements 24A and the reception antenna elements 26A may also be at least partially provided by the DUT 22. For example, a transmission antenna element 24A may be separate of the DUT 22 while a reception antenna element 26A may be internal with regard to the DUT 22 or vice versa.

The transmission antenna elements 24A are configured to emit an electromagnetic wave towards the DUT 22 in response to the transmission stream 28A associated thereto. While the first electromagnetic wave 34A is reflected by the first reflecting surface 18A before it impinges the DUT 22, a second electromagnetic wave 34B directly propagates towards the DUT 22.

The reflection process 36 of the first electromagnetic wave 34A at the first reflecting surface 18A amongst others depends on the reflecting properties of the first reflecting surface 18A. In this regard, the first reflecting surface 18A is configured to variably modify in a defined manner its reflecting properties.

To this end, the present system 20 comprises a processing circuit 38 which is coupled to the first reflecting surface 18A, the second reflecting surface 18B, and the MIMO antenna array 32. The processing circuit 38 may transmit control signals, e.g. electric signals, to the first reflecting surface 18A.

In response to the control signals the reflecting properties of the first reflecting surface 18A may be modified "in-field". This means that the anechoic chamber 10 does not need to be opened in order to alter the reflecting properties of the reflecting surface 18A. Hence, no manual access to the anechoic chamber 10 or the first reflecting surface 18A is required in this regard. The modification of the reflecting properties is achieved during the testing procedure of the DUT 22, for example during an ongoing testing. Thereby, potential time delays caused by the modification of the reflecting properties are prevented.

Furthermore, an automatic test sequence can be performed that comprises several different tests/measurements with different reflecting properties of the reflecting surface 18A.

Example modification includes a non-negligible reflecting coefficient is only provided with regard to the first partial surface area 40A of the first reflecting surface 18A. This means that the second partial surface area 40B only shows a negligible reflecting coefficient. Accordingly, an electromagnetic wave 34A impinging the second partial surface area 40B will be substantially absorbed and not reflected by this partial surface area 40B.

Moreover, the reflecting properties may also be altered such that a non-negligible reflecting coefficient is only provided for a limited reflecting angle range 42. Of course, the reflecting angle depends on the incident angle of the electromagnetic wave 34A. In other words, for electromagnetic waves 34A impinging the first reflecting surface 18A according to certain incident angles, the reflecting coefficient may be different then compared to an electromagnetic wave impinging the first reflecting surface 18A at a different incident angle.

The aforementioned modifications of the reflecting properties of the reflecting surface 18A may also be combined. These modifications may be achieved in response to stimulus provided by the processing circuit 38 which acts as a control circuit in this regard.

Therefore, tailored electromagnetic wave scenarios may be established within the testing area 16 of the anechoic chamber 10 in view of the DUT 22.

The reception antenna elements 26A, 26B are configured to receive electromagnetic waves 44A, 44B propagating to the reception antenna elements 26A, 26B and to establish respective reception streams 30A, 30B associated thereto. Likewise, the received electromagnetic waves 44A, 44B may have been the subject of reflection processes before being received.

The present embodiment shows reflecting surfaces 18A, 18B being substantially flat. In other words, the reflecting surfaces 18A, 18B have only negligible protrusions or depressions. Moreover, the reflecting surfaces 18A, 18B may optionally be part of wall portions 46A, 46B of the anechoic chamber 10 which delimit the testing area 16.

The second reflecting surface 18B may be established in a similar manner as the first reflecting surface 18A. However, the second reflecting surface 18B may also comprise different surface areas or rather different properties to be modified compared with the first reflecting surface 18A. Hence, the different reflecting surfaces 18A, 18B may be used for different testing purposes as they are enabled to modify the properties in a different manner.

Figure 3:
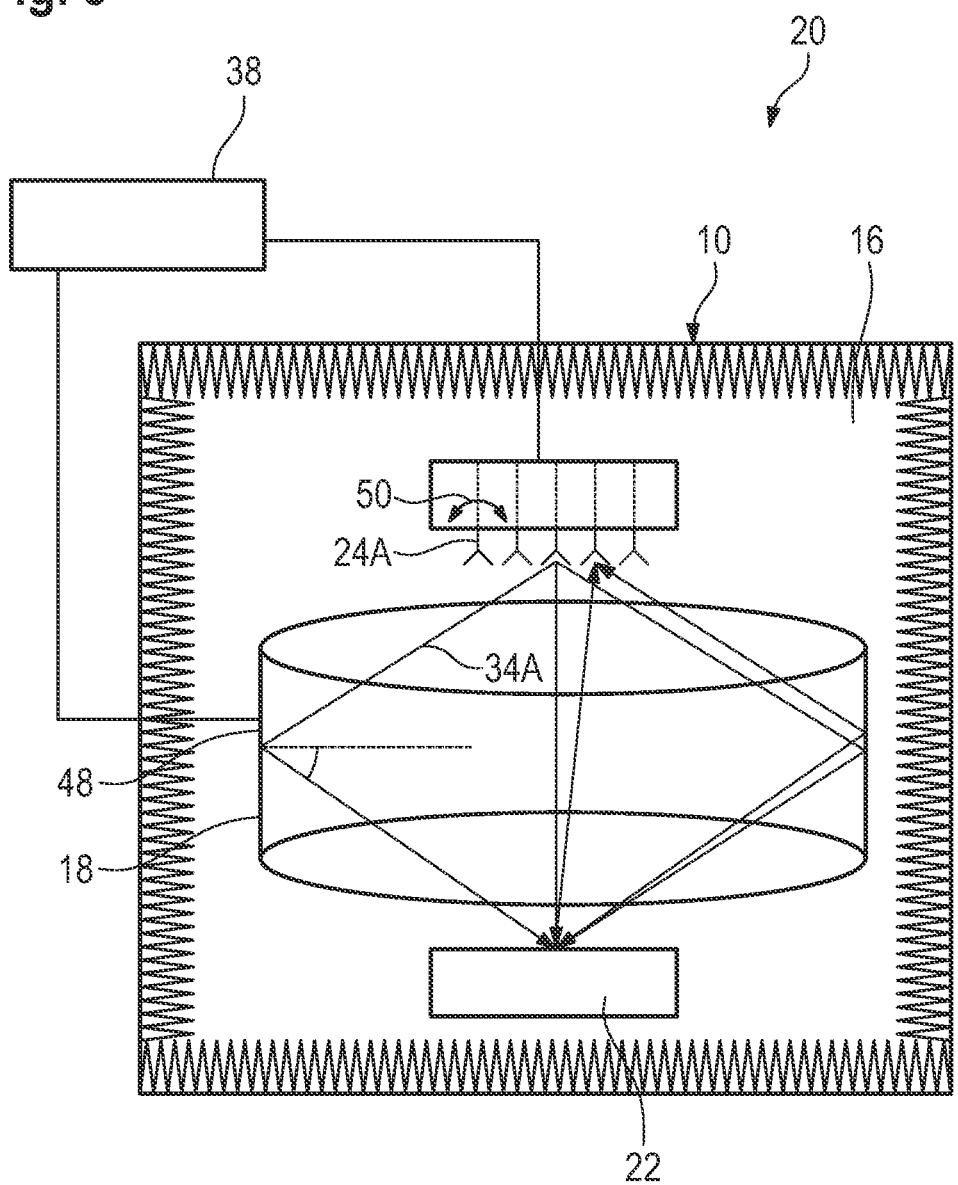
FIG. 3 is a schematic drawing of a system for testing a device under test over-the-air.

FIG. 3 is a schematic drawing of a system 20 for testing a DUT 22 over-the-air according to another embodiment. This embodiment substantially corresponds to the embodiment described hereinbefore with reference to FIG. 2. Therefore, only distinguishing features are described.

Within the present embodiment, only a single reflecting surface 18 is provided. The reflecting surface 18 has a cylindrical shape 48. Therefore, highly symmetric reflecting scenarios may be established, especially if the DUT 22 is arranged in accordance with the longitudinal extension axis of the cylindrical shape 48. Consequently, evaluation of the testing procedure is simplified. Still, the reflecting surface 18 may be considered to be flat since it does not comprise any noticeable depressions or protrusions extending from the general curvature of the cylindrical shape 48. Put differently, the reflecting surface 18 has only depressions and protrusions which are negligible with regard to the reflecting process 36.

Still, the modification of the reflecting properties may be caused by a stimulus provided by the signal caused by the processing circuit 38 that may act as a control circuit.

For example, the reflecting properties may be altered in response to specific configurations of the transmission antenna elements 24A or the reception antenna elements 26A. In this regard, exemplarily a polarization axis 50 of an electromagnetic wave 34A transmitted by first transmission antenna element 24A may be modified to investigate the DUT 22 in different aspects. In response to modification of the polarization axis 50, the reflecting properties of the reflecting surface 18A are variably modifiable in a defined manner. Alternatively, signals with different frequencies or rather different collimations shall be used for testing purposes, which can be done by using the reflecting surfaces 18A, 18B for beam-steering.

FIG. 4 is a schematic drawing of a method 52 of testing a DUT 22 under test over-the-air. Optional steps are shown in dashed lines.

Within the first step 54 an anechoic chamber 10 is provided having a testing area 16 with the DUT 22 and at least one reflecting surface 18A arranged therein. The anechoic chamber 10 comprises at least one transmission antenna element 24A and/or at least one reception antenna element 26A.

Subsequently, in step 56 at least one electromagnetic wave 34A is emitted. Afterwards, in step 58, using the at least one reflecting surface 18A, at least one reflection process 36 of the at least one electromagnetic wave 34A is variably manipulated in a defined manner. In step 60 the at least one electromagnetic wave 34A reflected by the at least one reflecting surface 18A is received.

Since the reflecting properties of the reflecting surface 18A are variably manipulated in a defined manner, tailored reflecting scenarios may be provided in view of the DUT 22. Consequently, the DUT 22 may be investigated in several desired aspects.

Optionally, step 58 may be further developed by partial step 62, where the at least one reflecting surface 18A is variably manipulated to have a non-negligible reflection coefficient within a partial surface area 40A thereof.

Alternatively or cumulatively, step 58 may also be further developed by partial step 64, where the at least one reflecting surface 18A is variably manipulated to have a non-negligible reflection coefficient with regard to a limited reflection angle range 42.

Embodiments of the method 52 may also include the optional step 66 of variably manipulating, using the at least one reflecting surface 18A, at least one refraction process or diffraction process of the at least one electromagnetic wave 34A.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In some examples, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An anechoic chamber for testing a device under test over-the-air, the anechoic chamber comprising at least one reflecting surface being coupled to a control circuit and being configured to variably manipulate in a defined manner at least one reflection process of at least one electromagnetic wave usable for testing the device under test, wherein a variable manipulation of the reflection process is caused by at least one property of the at least one reflecting surface being variably controlled in-field by a control signal of the control circuit, and wherein at least a direction of the at least one electromagnetic wave is manipulatable based on the variable manipulation of the reflection process.

2. The anechoic chamber of claim 1, wherein the at least one reflecting surface is configured to variably have a non-negligible reflection coefficient within a partial surface area thereof.

3. The anechoic chamber of claim 1, wherein the at least one reflecting surface is configured to variably have a non-negligible reflection coefficient with regard to a limited reflection angle range.

4. The anechoic chamber according to claim 1, wherein the at least one reflecting surface is configured to variably manipulate at least one refraction process or diffraction process of the at least one electromagnetic wave.

5. A system for testing a device under test over-the-air, the system comprising the anechoic chamber and a device under test,
wherein the anechoic chamber comprises at least one reflecting surface being coupled to a control circuit and being configured to variably manipulate in a defined manner at least one reflection process of at least one electromagnetic wave usable for testing the device under test,
wherein the anechoic chamber comprises a testing area,
wherein the system has at least one transmission antenna element and/or at least one reception antenna element, and
wherein the device under test and the at least one reflecting surface are arranged within the testing area, and
wherein a variable manipulation of the reflection process is caused by at least one property of the at least one reflecting surface being variably controlled in-field by a control signal of the control circuit, and wherein at least a direction of the at least one electromagnetic wave is manipulatable based on the variable manipulation of the reflection process.

6. The system of claim 5, wherein the at least one reflecting surface at least partially comprises a cylindrical shape.

7. The system of claim 5, wherein the anechoic chamber comprises at least one wall portion delimiting the testing area and having the at least one reflecting surface, wherein the at least one reflecting surface is substantially flat.

8. The system according to claim 5, wherein the anechoic chamber comprises at least two transmission antenna elements and at least two reception antenna elements establishing a multiple-input/multiple-output antenna array.

9. The system according to claim 5, wherein the at least one reflecting surface at least partially comprises materials, devices or elements selected from the group consisting of graphene, nonlinear optical materials, non-foster elements, ferrites, YIG, BST, liquid crystals, microfluidics, mechanical elements, MEMS, PIN diodes, and varactors.

10. The system according to claim 5, comprising at least one processing circuit that is coupled to the at least one transmission antenna element and/or the at least one reception antenna element, and wherein the at least one processing circuit is also coupled to the at least one reflecting surface.

11. A method of testing a device under test over-the-air, the method comprising:
providing an anechoic chamber having a testing area with the device under test and at least one reflecting surface arranged therein and being coupled to a control circuit, the anechoic chamber comprising at least one transmission antenna element and/or at least one reception antenna element,
emitting at least one electromagnetic wave,
variably manipulating, using the at least one reflecting surface, at least one reflection process of the at least one electromagnetic wave in a defined manner, wherein a variable manipulation of the reflection process is caused by at least one property of the at least one reflecting surface being variably controlled in-field by a control signal of the control circuit, and wherein at least a direction of the at least one electromagnetic wave is manipulatable based on the variable manipulation of the reflection process, and
receiving the at least one electromagnetic wave reflected by the at least one reflecting surface.

12. The method of claim 11, wherein the at least one reflecting surface is variably manipulated to have a non-negligible reflection coefficient within a partial surface area thereof.

13. The method of claim 11, wherein the at least one reflecting surface is variably manipulated to have a non-negligible reflection coefficient with regard to a limited reflection angle range.

14. The method according to claim 11 further comprising:
variably manipulating, using the at least one reflecting surface, at least one refraction process or diffraction process of the at least one electromagnetic wave.

15. The method according to claim 11, wherein, using at least two transmission antenna elements, multiple electromagnetic waves are emitted, and wherein, using at least two reception antenna elements, multiple electromagnetic waves reflected by the at least one reflecting surface are received to test the device under test based on a multiple-input/multiple-output antenna array.

* * * * *